(12) United States Patent
Kim

(10) Patent No.: US 7,599,417 B2
(45) Date of Patent: Oct. 6, 2009

(54) LASER PUMPING UNIT AND HIGH POWER LASER DEVICE TUNNEL JUNCTION INCLUDING THE SAME

(75) Inventor: Taek Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 13 days.

(21) Appl. No.: 11/190,828

(22) Filed: Jul. 28, 2005

(65) Prior Publication Data
US 2006/0078027 A1    Apr. 13, 2006

(30) Foreign Application Priority Data
Oct. 11, 2004    (KR) .................... 10-2004-0081059

(51) Int. Cl.
*H01S 5/00* (2006.01)
*H01S 3/08* (2006.01)
(52) U.S. Cl. .............. 372/50.23; 372/50.124; 372/101; 372/108
(58) Field of Classification Search ............ 372/50.124, 372/50.23, 101, 108
See application file for complete search history.

(56) References Cited

U.S. PATENT DOCUMENTS

| | | | |
|---|---|---|---|
| 5,966,399 A * | 10/1999 | Jiang et al. ................... 372/96 |
| 6,243,407 B1 | 6/2001 | Mooradian | |
| 6,791,117 B2 * | 9/2004 | Yoshitake et al. ............. 257/94 |
| 7,136,406 B2 * | 11/2006 | Ryou .................... 372/45.011 |
| 7,346,089 B2 * | 3/2008 | Ueki et al. ............. 372/50.124 |
| 2001/0050934 A1 * | 12/2001 | Choquette et al. ............. 372/43 |
| 2003/0185268 A1 * | 10/2003 | Zhang .......................... 372/96 |
| 2005/0063440 A1 * | 3/2005 | Deppe .......................... 372/50 |
| 2006/0083283 A1 * | 4/2006 | Kondo ................... 372/50.124 |

* cited by examiner

*Primary Examiner*—Wael Fahmy
*Assistant Examiner*—Hrayr A Sayadian
(74) *Attorney, Agent, or Firm*—Cantor Colburn LLP

(57) ABSTRACT

Embodiments include a laser pumping unit and a high power vertical external cavity surface emitting laser (VECSEL) device including the same. The laser pumping unit easily diffuses current in a traverse direction by using a tunnel junction. The laser pumping unit may include a substrate, a lower distributed brag reflector (DBR) layer formed on the substrate, an active layer with a quantum well structure formed on the lower DBR layer to generate a light having a predetermined wavelength, a tunnel junction layer formed on the active layer to increase resistance in a vertical direction, and an upper DBR layer formed on the tunnel junction layer.

16 Claims, 11 Drawing Sheets

LASER PUMPING UNIT AND HIGH POWER LASER DEVICE TUNNEL JUNCTION INCLUDING THE SAME

This application claims the priority of Korean Patent Application No. 10-2004-0081059, filed on Oct. 11, 2004, in the Korean Intellectual Property Office, the disclosure of which is incorporated herein in its entirety by reference.

BACKGROUND OF THE DISCLOSURE

1. Field of the Disclosure

The present invention relates to a laser pumping unit having a tunnel junction and a high power laser device including the same, and more particularly, to a laser pumping unit and a high power vertical external cavity surface 15 emitting laser (VECSEL) of easily diffusing current in a traverse direction by using the tunnel junction including the same.

2. Description of the Related Art

FIG. 1 is a sectional view of a conventional vertical cavity surface emitting laser (VCSEL) 10, which emits a laser beam in a perpendicular direction to a substrate. Referring to FIG. 1, the conventional VCSEL 10 is formed by sequentially stacking a substrate 11 formed of n-GaAs, a lower distributed brag reflector (DBR) layer 13, an active layer 14, and an upper DBR layer 16. The lower and upper DBR layers 13 and 16 operate as reflection layers, and have high reflectance for the oscillation wavelength of a laser. The lower DBR layer 13 is an n-type DBR layer doped with an n-type impurity, and the upper DBR layer 16 is a p-type DBR layer doped with a p-type impurity. A metal contact 17 for supplying a current to the active layer 14 is formed on the upper DBR layer 16. When the current is supplied to the active layer 14, holes and electrons are recombinated in the active layer 14 to generate a light. The light is repeatedly reflected between the upper DBR layer 16 and the lower DBR layer 13 and amplified in the active layer 14. Then, the light is emitted through the upper DBR layer 16, as a laser beam.

In such a VCSEL 10, resistance in a traverse direction is substantially greater than resistance in a vertical direction, and thus the current condenses at the edges of an aperture of the active layer 14. This is referred to as current crowding. Curves A in FIG. 1 illustrate current density profile. Referring to FIG. 1, the current density is lower at the center of the active layer 14 than at the edges of the active layer 14 due to the high resistance in the traverse direction. Accordingly, a single traverse mode oscillation is impossible in the VCSEL 10. In order to prevent such a problem, an oxide layer 15 is formed by oxidizing the edges of the active layer 14 to restrict the size of the aperture which acts as a current injection area, to about 5 pm. An ion injection layer may be used instead of the oxide layer 15. Due to a small aperture of the conventional VCSEL 10, the power of the conventional VCSEL 10 is as small as a few mW.

A vertical external cavity surface emitting laser (VECSEL) is a high power laser. A VECSEL obtains high power (a minimum of hundreds mW) by increasing a gain area by using an external mirror. FIG. 2 is a sectional view of a conventional VECSEL 20. Referring to FIG. 2, the VECSEL 20 includes a laser pumping unit 25 having a substrate 21, a lower DBR layer 22, an active layer 23, and an upper DBR layer 24, and a concave external mirror 26. Laser cavities are formed between the lower DBR layer 22 and the upper DBR layer 24, and between the lower DBR layer 22 and the external mirror 26, respectively. A light generated in the active layer 23 is repeatedly reflected between the lower DBR layer 22 and the upper DBR layer 24 and between the lower DBR layer 22 and the external mirror 26 to reciprocate in the active layer 23. Accordingly, a portion of the light having a predetermined wavelength $\lambda_2$ is output to the outside as a laser beam through the external mirror 26, and the other portion of the light is reflected to be used in an optical pumping operation.

Methods of exciting the active layer 23 in the VECSEL 20 include an optical pumping method and an electric pumping method. In the optical pumping method, a light beam having a shorter wavelength $\lambda_1$ than the wavelength $\lambda_2$ of the laser beam 30 is input to the laser pumping unit 25 through a pump laser 27. In the electric pumping method, a current is supplied to the active layer 23 through a metal contact formed in the upper DBR layer 24, as shown in FIG. 1. However, the electric pumping method in the VECSEL cannot solve the problem of the VCSEL. Furthermore, the VECSEL has a large aperture of about 20 to 100 μm. Accordingly, a problem of current concentrating at the edges of the aperture becomes serious, and it becomes difficult to produce single traverse mode oscillation.

A high power laser 30 shown in FIG. 3 is disclosed in U.S. Pat. No. 6,243,407 applied by Aram Moorairan et al. on Jul. 7, 1997 under the title of "high power laser devices, in order to solve such a problem. Referring to FIG. 3, the laser 30 includes a p-type DBR layer 31, an active layer 32, an n-type DBR layer 33, a substrate 34, and an external mirror 38. In addition, a circular contact layer 35 is formed under the p-type DBR layer 31, and ring-shaped contact layers 36 are formed on the substrate 34 to supply current to the active layer 32 via the contact layers 35 and 36. The substrate 34 has a thickness of about 500 μm and is formed of transparent n-GaAs to transmit an oscillation wavelength. Laser cavities are formed between the p-type DBR layer 31 and the n-type DBR layer 33, and between the p-type DBR layer 31 and the external mirror 38. In addition, a second harmonic generation (SHG) crystal 37 for doubling the frequency of a light may be arranged between the external cavity 38 and the substrate 34.

Referring to FIG. 3, the laser 30 is designed for the beam generated in the active layer 32 to transmit the substrate 34. In other words, the substrate 34 is arranged in the laser cavity, between the p-type DBR layer 31 and the external mirror 38. Accordingly, a current 39 may be sufficiently diffused in a traverse direction while flowing through the relatively thick substrate 34, thereby preventing current crowding. As a result, the laser device 30 may generate a single traverse mode oscillation.

However, the laser 30 has problems. Free carrier absorption due to n-GaAs, which is generally used for the substrate 34, restricts the output and the efficiency of the laser device 30. More specifically, such a problem may be serious because the substrate 34 has a large thickness.

In addition, in a conventional VECSEL, about 30% of the optical energy, which resonates in laser cavities, exists in the laser cavity formed between the upper DBR layer and the lower DBR layer and the other 70% of the optical energy exists in the laser cavity formed between the DBR layer and an external mirror. In the case of the laser device 30 of FIG. 3, about 30% of the optical energy is distributed in the laser cavity formed between the DBR layer 31 and the external mirror 38 in order to reduce the effect of the free carrier absorption. On the other hand, the efficiency of the SHG crystal 37, which is formed between the substrate 34 and the external mirror 38, increases proportionally to the optical energy. As a result, the efficiency of the laser device 30 of FIG. 3 is deteriorated.

Furthermore, the distance of an optical path between the external mirror 38 and the DBR layer 31 is relatively large, and thus a convex surface of the external mirror 38 should be precisely manufactured to precisely converge a beam reflected from the external mirror 38 onto the DBR 31. Accordingly, it is difficult to arrange the SHG crystal 37 at an optimum location.

SUMMARY OF THE DISCLOSURE

Embodiments of the present invention provide a laser pumping unit and a high power vertical external cavity surface emitting laser (VECSEL) including the same. The laser pumping unit does not have a loss due to free carrier absorption and may be easily manufactured by realizing current diffusion in a traverse direction using a simple structure.

According to an aspect of the present invention, there may be provided a laser pumping unit for a surface emitting semiconductor laser, comprising a substrate, a lower distributed Bragg-reflector (DBR) layer formed on the substrate, an active layer with a quantum well structure formed on the lower DBR layer to generate a light having a predetermined wavelength, a tunnel junction layer formed on the active layer to increase resistance in a thickness direction of the laser pumping unit, and an upper DBR layer formed on the tunnel junction layer.

The tunnel junction layer may comprise a p-type doped p+ semiconductor layer and an n-type doped n+ semiconductor layer stacked sequentially, and the doping concentration of each of the p+ semiconductor layer and the n+ semiconductor layer may be $5 \times 10^{18}/cm^3$ to $5 \times 10^{19}/cm^3$.

Each of the lower DBR layer and the upper DBR layer may have a multi-layered structure in which pluralities of doped high refractive index semiconductor layers and doped low refractive index semiconductor layers are alternately deposited, and the thickness of each of the high refractive index semiconductor layers of the upper DBR layer may be three quarters of an oscillation wavelength and the thickness of each of the lower refractive index semiconductor layers may be one quarter of the oscillation wavelength.

A portion of each of the high refractive index semiconductor layers and the low refractive index semiconductor layers of the upper DBR layer disposed above the tunnel junction layer may form a ridge with a predetermined height.

In addition, the laser pumping unit may further comprise a current diffusion 5 layer formed on the upper DBR layer. The laser pumping unit may further comprise an anti-reflection film formed on the current diffusion layer, a and a portion of the current diffusion layer disposed above the tunnel junction layer may form a convex lens.

According to another aspect of the present invention, there may be provided a semiconductor laser device comprising a laser pumping unit of generating a light with a predetermined wave length, and an external mirror unit located outside of the laser pumping unit to transmit a portion of the light generated by the laser pumping unit as a laser beam and reflect the other portion of the light toward the laser pumping unit, which absorbs the reflected portion of the light, wherein the laser pumping unit comprises a substrate, a lower DBR layer formed on the substrate, an active layer with a quantum well structure formed on the lower DBR layer to generate a light having a predetermined wavelength, a tunnel junction layer formed on the active layer to increase resistance in a thickness direction of the laser pumping unit, and an upper DBR layer formed on the tunnel junction layer.

The laser device may further comprise a second harmonic generation (SHG) crystal for doubling a frequency of the light interposed between the laser pumping unit and the external mirror.

BRIEF DESCRIPTION OF THE DRAWINGS

The above and other features and advantages of embodiments of the present invention will become more apparent by describing in detail exemplary embodiments thereof with reference to the attached drawings in which.

DETAILED DESCRIPTION OF THE EXEMPLARY EMBODIMENTS

Exemplary embodiments of the present invention will now be described more fully with reference to the accompanying drawings, in which the exemplary embodiments of the present invention are shown.

Figure 1:
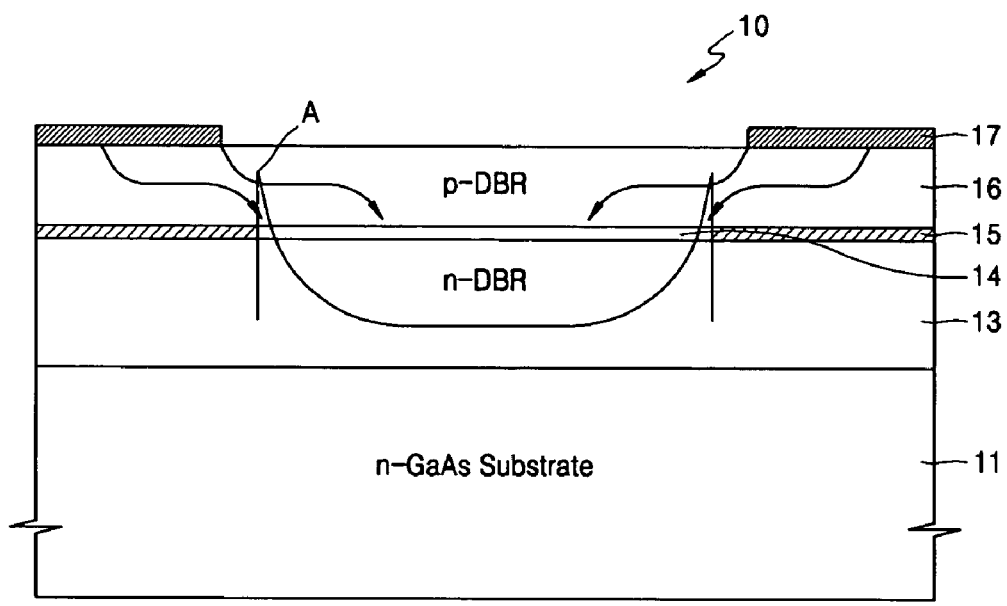
FIG. 1 is a sectional view of a conventional surface emitting laser.
Figure 2:
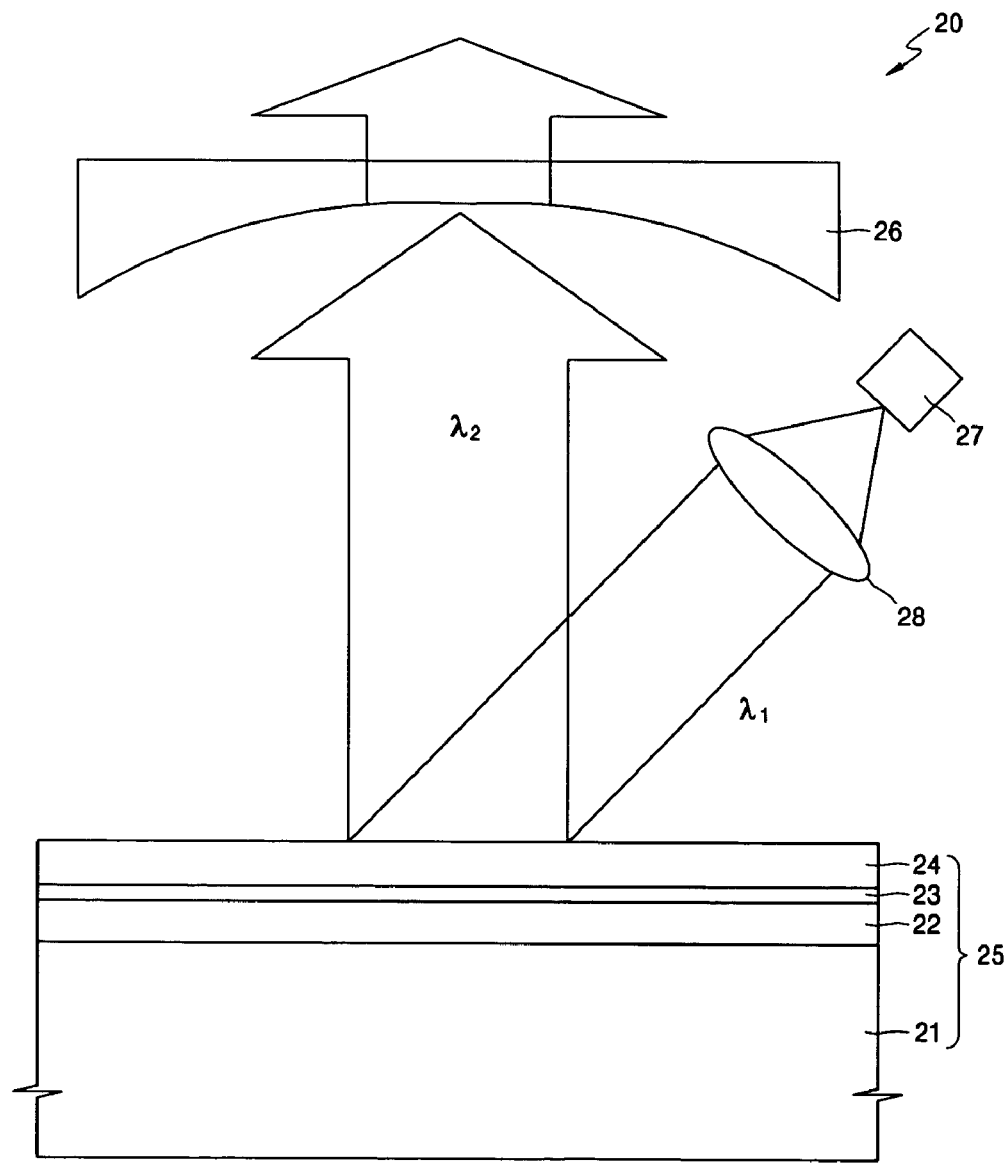
FIG. 2 is a sectional view of a conventional vertical external cavity surface 30 emitting laser (VECSEL)
Figure 3:
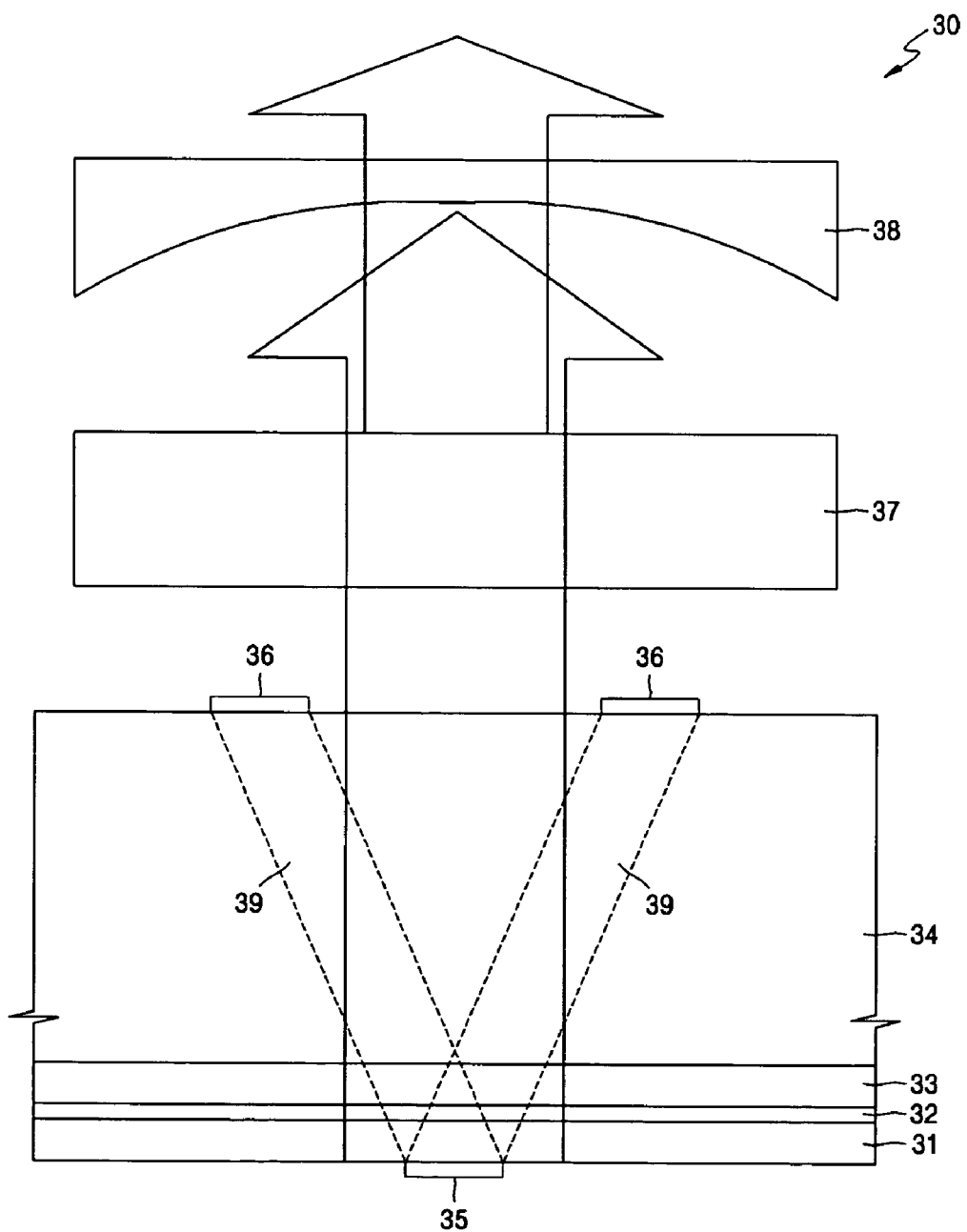
FIG. 3 is a sectional view of another conventional VECSEL.
Figure 4:
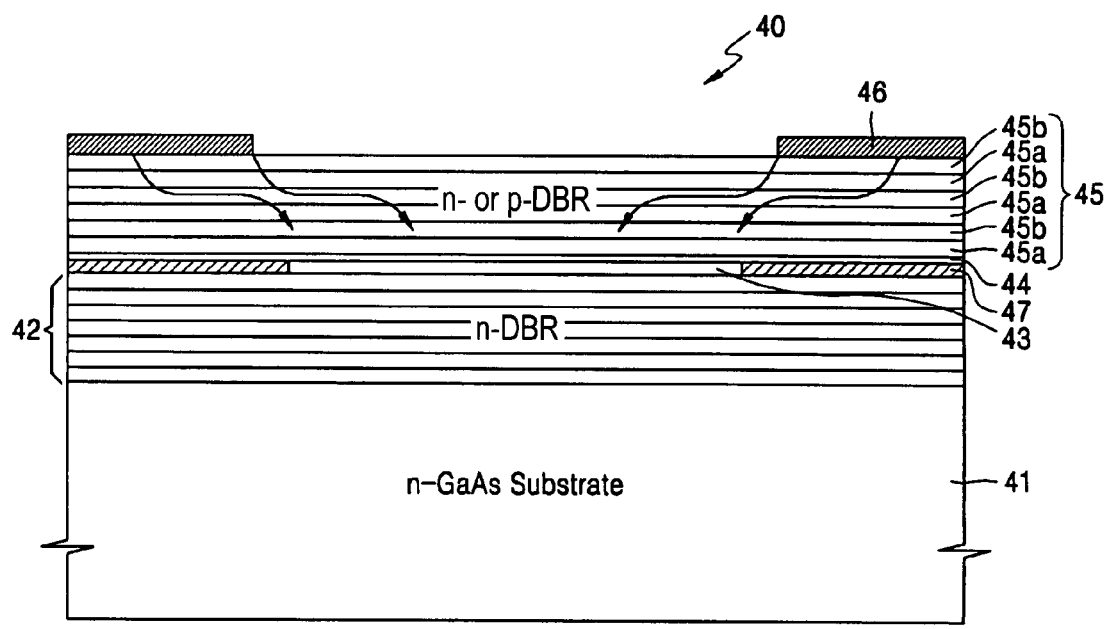
FIG. 4 is a sectional view of a laser pumping unit of a laser device according to a first embodiment of the present invention.

FIG. 4 is a sectional view of a laser pumping unit 40 having a tunnel junction layer according to a first embodiment of the present invention. Referring to FIG. 4, the laser pumping unit 40 may include an n-GaAs substrate 41, a lower distributed brag reflector (DBR) layer 42, an active layer 43, a tunnel junction layer 44, and an upper DBR layer 45. In addition, a metal contact 46 for supplying current to the active layer 43 may be formed on the DBR layer 45. An oxide layer 47 may be formed at the edge of the active layer 43 to restrict the size of an aperture that acts as a current injection area. An ion injection layer may be used instead of the oxide layer 47.

The tunnel junction layer 44 may increase resistance in a vertical direction (the direction of its thickness) to facilitate the distribution of current in a traverse direction. In a conventional laser device, the current injected through a metal contact located at the edge of an upper DBR layer is not sufficiently transferred to the center of an active layer but is concentrated at the edge of an aperture, because a. resistance in a traverse direction is larger than a resistance in a vertical direction. In the pumping unit 40 according to the first embodiment of the present invention, a resistance in a vertical direction may be increased by the tunnel junction layer 44 and thus a current density distribution in the active layer 43 is uniform, allowing for the generation of a single traverse mode oscillation.

Figure 5:
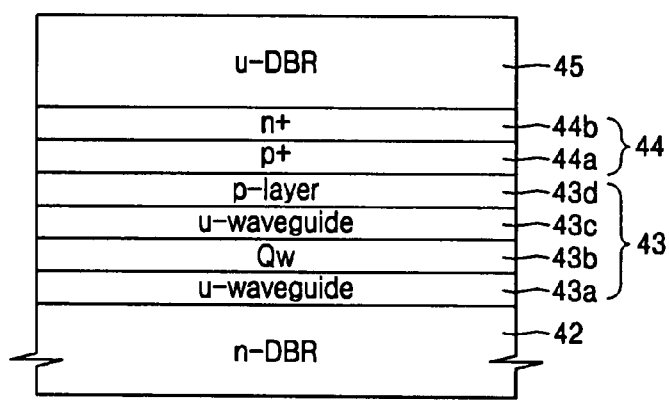
FIG. 5 is a sectional view of a tunnel junction layer and an active layer of the laser pumping unit illustrated in FIG. 4.

FIG. 5 is a sectional view of the lower DRB layer 42, the active layer 43, the tunnel junction layer 44, and the upper DRB layer 45. Referring to FIG. 5, the active layer 43 and the tunnel junction layer 44, which have multi-layered structures, may be deposited between the lower DBR layer 42 and the upper DBR layer 45. The active layer 43 may include a quantum well 43b between undoped waveguide layers 43a and 43c, and a p-type semiconductor layer 43d formed on the upper waveguide layer 43c. The p-type semiconductor layer 43d may provide holes to the quantum well 43b, and the holes and electrons are recombinated in the quantum well 43b to generate a beam.

The tunnel junction layer 44 may be formed by joining a highly doped p+ semiconductor layer 44a and a highly doped n+ semiconductor layer 44b. When semiconductor layers are highly doped, current may flow between the semiconductor layers due to a tunnel effect in which the boundary states between the semiconductor layers change, allowing electrons to pass through an energy barrier without jumping the energy barrier. In this case, as the doping concentration is increased, a band gap may be reduced, along with resistance to electrons passing through the energy barrier. Accordingly, a tunnel junction layer may be used to flow currents in a structure of not flowing currents, such as an n-p-n junction. In addition, the doping concentration may be increased to lower resistance. However, in the present invention, the doping concentration may be lower than in a conventional tunnel junction to that a large resistance exists in the tunnel junction layer. As a result, while electrons pass through the tunnel junction layer 44 having a large resistance in a vertical direction, the current easily flows in the traverse direction, and thus the current density may be uniformly distributed in the active layer 43.

Figure 6:
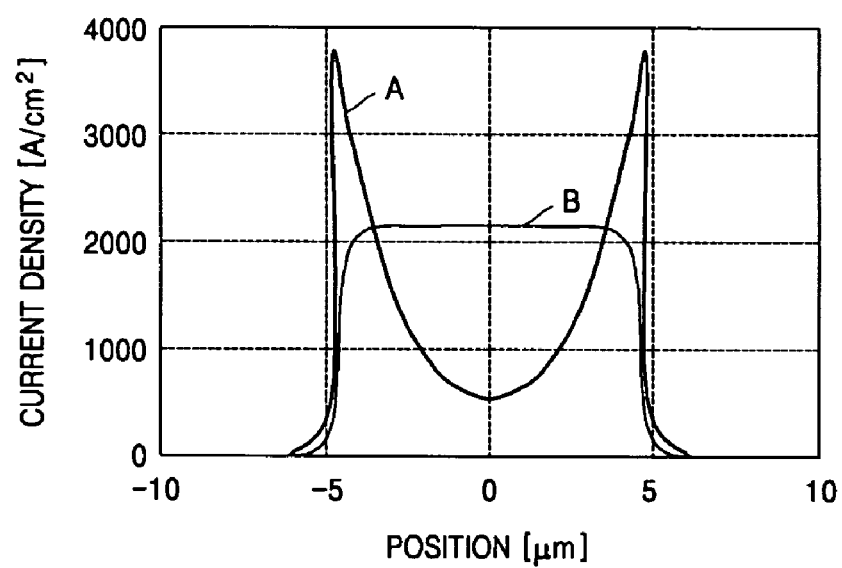
FIG. 6 is a graph illustrating current density distributions in active layers of a conventional laser device and a laser device according to an embodiment of the present invention.

FIG. 6 is a graph illustrating current density distributions in active layers of a conventional laser device not including a tunnel junction layer and a laser device using a tunnel junction layer according to an embodiment of the present invention. The graph denoted by reference character A illustrates the current density distribution of the conventional laser device, and the graph denoted by reference character B illustrates the current density distribution of the laser device according to an embodiment of the present invention. Referring to FIG. 6, the current density may be concentrated at the edges of the active layer in the conventional laser device; however, the current density may be uniformed distributed in the active layer of the laser device according to an embodiment of the present invention. As a result, even when an aperture is formed as large as about 20 to 100 μm, a single traverse mode oscillation may be possible, and because a large aperture can be used, a high power laser may be provided.

In such a structure, when the doping concentrations of the p-type semiconductor layer 44a and the n-type semiconductor layer 44b of the tunnel junction layer 44 are excessively low, a tunneling phenomenon may not occur. However, when the doping concentrations of the p-type semiconductor layer 44a and the n-type semiconductor layer 44b are excessively high, the resistance in the vertical direction may be too low to sufficiently distribute the current density. Thus, sufficient doping concentrations should be maintained. A conventional tunnel junction layer is doped at a concentration of $10^{20}/cm^3$ to lower a resistance; however, the tunnel junction layer 44 according to an embodiment of the present invention may be doped at a concentration of about $5 \times 10^{18}$ cm$^3$ to about $5 \times 10^{19}$ cm$^3$ to provide sufficient resistance in the vertical direction. In addition, the thickness of the tunnel junction layer 44 is desirably lowered to facilitate the tunneling phenomenon. In the present invention, the thickness of the tunnel junction layer 44 may be less than about tens of nm, more specifically, less than about 40 nm.

In the laser pumping unit according to the first embodiment of the present invention, the current flows through the tunnel junction layer 44, thus, an n-DBR layer may be used as the upper DBR layer 45 instead of a p-DBR layer. When the tunnel junction layer 44 is absent and the lower and upper DBR layers 42 and 45 are n-DBR layers, the current may not flow to the active layer 43. Thus, the upper DBR layer 45 is desirably a p-DBR layer. However, a p-type semiconductor may absorb more free carriers than an n-type semiconductor. In the laser pumping unit according to the first embodiment of the present invention, the tunnel junction layer 44 may be used, and thus, the current may flow to the active layer 43 even when the lower and upper DBR layers 42 and 45 are both n-DBR layers. Accordingly, an oscillation efficiency in the first embodiment may be better than the oscillation efficiency in a conventional laser pumping unit using a p-DBR layer as an upper DBR layer.

The lower and upper DBR layers 42 and 45 are formed by repeatedly depositing a plurality of n-type doped semiconductor layers having a high refractive index and n-type doped semiconductor layers having a low refractive index, in order to have a high reflectivity for a bandwidth around an oscillation wavelength. In general, a semiconductor layer having a high refractive index may be formed of GaAs, and a semiconductor layer having a low refractive index may be formed of AlAs. Referring to FIG. 4, only the upper DBR layer 45 is illustrated with a multi-layered structure; however, the lower DBR layer 42 also has a multi-layered structure. The thickness of each layer included in a DBR layer may be generally set to one quarter of an oscillation wavelength. However, the thickness of each of the layers included in the upper DBR layer 45 may be different from one quarter of an oscillation wavelength, in order to increase resistance in the vertical direction. For example, the thickness of a low refractive index layer 45a may be one quarter of an oscillation wavelength, and the thickness of a high refractive index layer 45b may be three quarters of the oscillation wavelength. Then, the length of a path in the vertical direction may be increased in the high refractive index layer 45b, and therefore the resistance in the vertical direction may be increased and the current may be uniformly distributed in the traverse direction.

Figure 7:
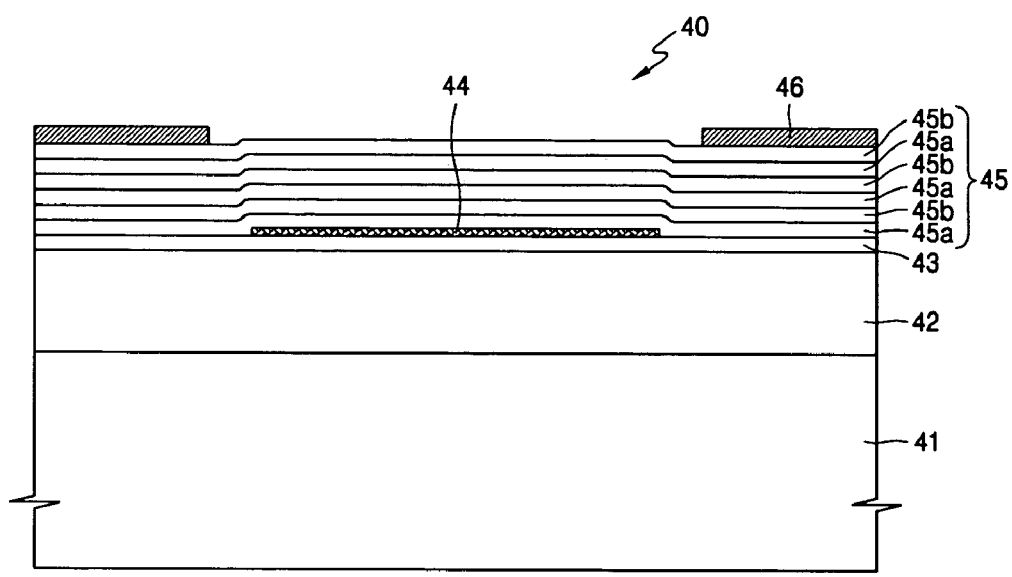
FIG. 7 is a sectional view of a laser pumping unit of a laser device according to a second embodiment of the present invention.

FIG. 7 is a sectional view of a laser pumping unit according to a second embodiment of the present invention. Referring to FIG. 7, a tunnel junction layer 44 partially covers an active layer 43. In addition, an upper DBR layer 45 may be formed on the tunnel junction layer 44 and the active layer 43. Accordingly, the tunnel junction layer 44 may be buried by the upper DBR layer 45. As a result, a portion of the upper DBR layer 45 formed on the tunnel junction layer 44 may be a ridge higher than the other portion of the upper DBR layer 45. A light generated in the active layer 43 travels vertically within the ridge portion. Thus, the ridge portion of the upper DBR layer 45 may operate as an aperture.

Figure 8:
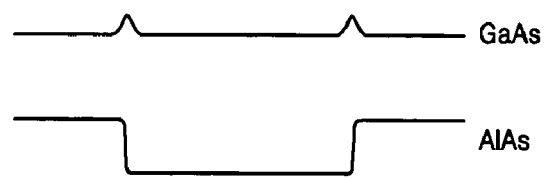
FIG. 8 illustrates an energy band of an upper distributed brag reflector (DBR) layer having a ridge including the laser pumping unit shown in FIG. 7.

In addition, when a doping concentration of a high refractive index layer 45b is greater than a doping concentration of a low refractive index layer 45a in the upper DBR layer 45, an energy band shown in FIG. 8 may be formed. As a result, current supplied from a contact layer 46 may flow within the ridge portion only. Accordingly, in the structure of FIG. 7 in which the tunnel junction layer 44 is buried, the laser pumping unit may operate without forming an additional current restriction member, such as an oxide layer or an ion injection layer. The remaining structure of the laser pumping unit of FIG. 7 is the same as the structure of the laser pumping unit of FIG. 4. For example, the thickness of each of the low refractive index layer 45a of the upper DBR layer 45 may be one quarter of an oscillation wavelength, and the thickness of each of the high refractive index layers 45b of the upper DBR layer 45 may be three quarters of the oscillation wavelength.

Figure 9:
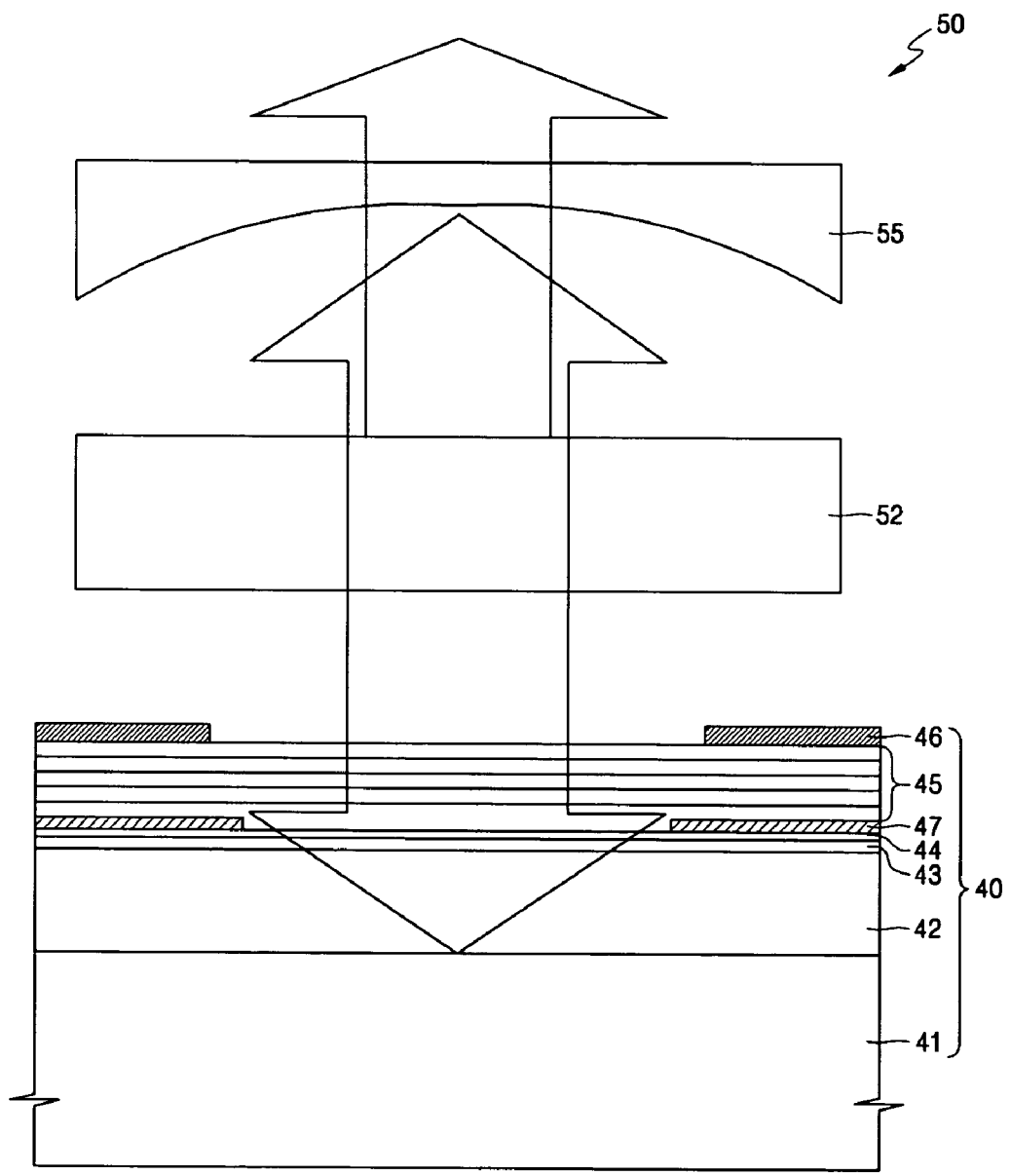
FIGS. 9 through 13 are sectional views of laser devices according to I embodiments of the present invention.

FIG. 9 is a sectional view of a vertical external cavity surface emitting laser (VECSEL) 50 according to an embodiment of the present invention. Referring to FIG. 9, the VECSEL 50 includes a laser pumping unit 40 and an external mirror 55. The laser pumping unit 40 may generate a light having a predetermined wavelength. The external mirror 55 may transmit a portion of the light generated by the laser pumping unit 40 as a laser beam, and may reflect the other portion of the light back to the laser pumping unit 40, which absorbs the reflected portion of the light. In addition, a second harmonic generation (SHG) crystal 52, which doubles the frequency of the light generated by the laser pumping unit 40, may be interposed between the laser pumping unit 40 and the external mirror 52. The SHG crystal 52 may convert an infrared light generated in the laser pumping unit 40 into a visible light. The SHG crystal 52 may be formed of potassium Titanyl Phosphate (KTP), $LiNbO_3$, periodically poled $LiNbO_3$ (PPLN), KTN, or $KnbO_3$.

The structure of the laser pumping unit 40 may be the same as the structure of the laser pumping unit of FIG. 4. Thus, the laser pumping unit 40 of FIG. 9 may include a substrate 41 formed of n-GaAs, a lower DBR layer 42, an active layer 43, a tunnel junction layer 44, an upper DBR layer 45, and a metal contact 46 supplying current to the active layer 43. In addition, an oxide layer 47 for restricting the size of an aperture acting as a current injection area may be included. As described above, the lower and upper DBR layers 42 and 45 may have multi-layered structures in which pluralities of high refractive index layers and low refractive index layers may be alternately stacked. In addition, the thickness of each of the high refractive index layers of the upper DBR layer 45 may be three quarters of an oscillation wavelength.

Figure 10:
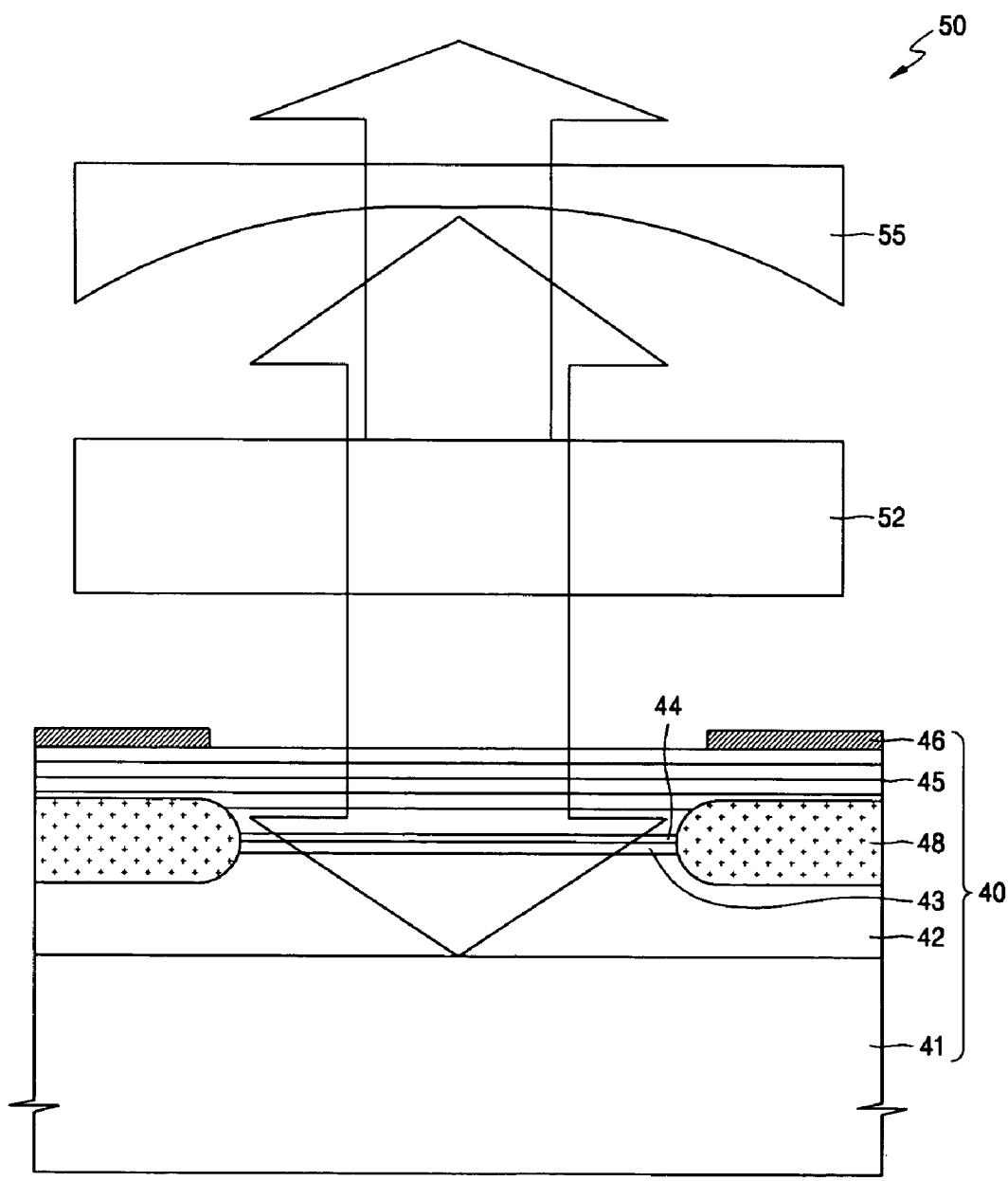

The structure of a VECSEL of FIG. 10 is the same as the structure of the VECSEL of FIG. 9 except that an ion injection layer 48 may be used as a current restriction member in a laser pumping unit 40 instead of the oxide layer 47.

Figure 11:
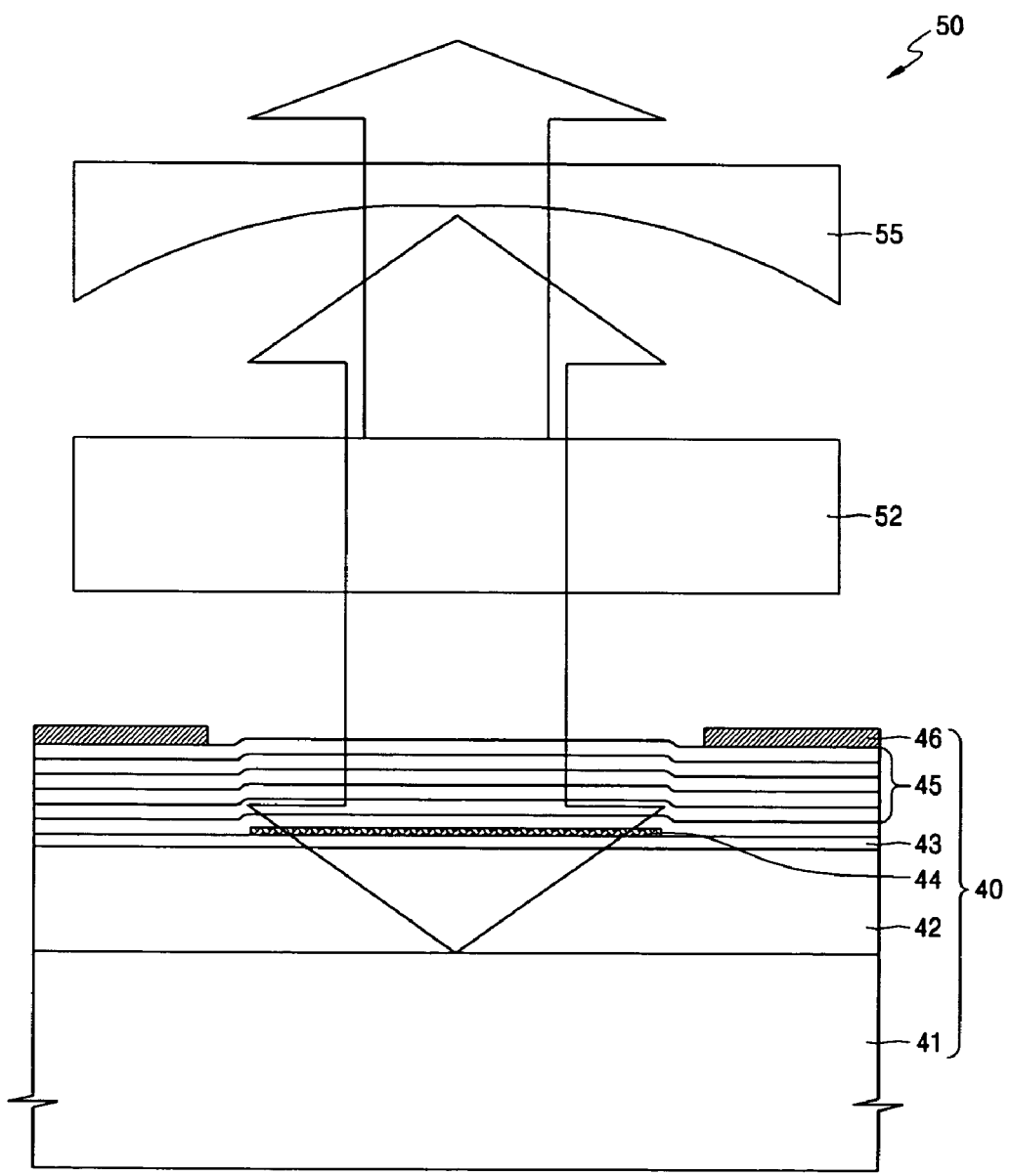

FIG. 11 is a sectional view of a VECSEL 50 using the laser pumping unit 40 of FIG. 7 according to the embodiment of the present invention. Referring to FIG. 11, the VECSEL 50 may include the laser pumping unit 40, which generates a light having a predetermined wavelength, and an external mirror 55, which transmits a portion of the light generated by the laser pumping unit 40 as a laser beam and reflects the other portion of the light back to the laser pumping unit 40, which absorbs the reflected portion of the light. In addition, an SHG crystal 52, which doubles the frequency of the light generated in the laser pumping unit 40, may be interposed between the laser pumping unit 40 and the external mirror 55.

In this case, the laser pumping unit 40 of FIG. 11 may include an n-GaAs substrate 41, a lower DBR layer 42, an active layer 43, a tunnel junction layer 44 which partially covers the active layer 43, an upper DBR layer 45 which may be formed on the active layer 43 and the tunnel junction layer 44 and may have a ridge, and a metal contact 46 for supplying current to the active layer 43. As described above, the light generated in the active layer 43 may travel vertically within the ridge of the DBR layer 45. In addition, the doping concentration of a low refractive index layer 45 a of the upper DBR layer 45 may be greater than the doping concentration of a high refractive index layer 45a of the upper DBR layer 45, and thus the current may flow within the ridge portion of the upper DBR layer 45.

Figure 12:
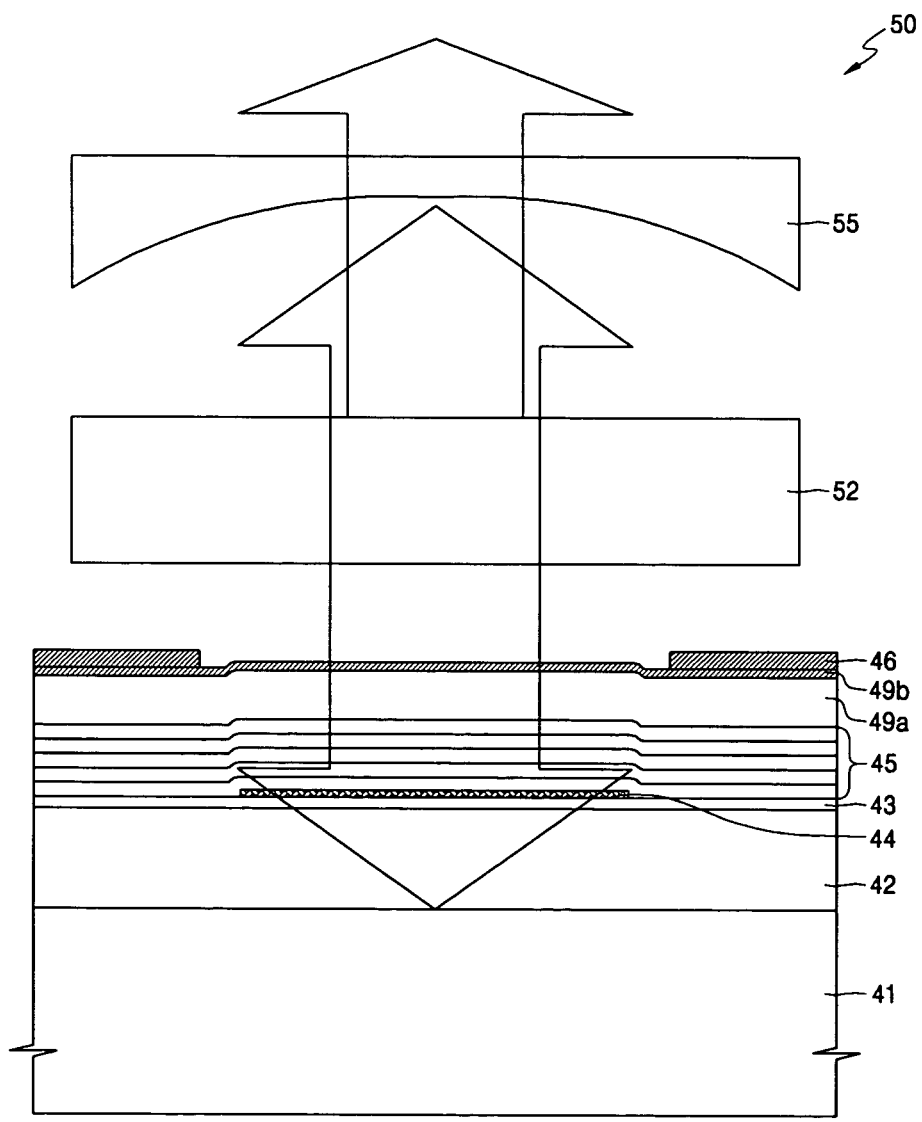

FIG. 12 is a sectional view of a VECSEL 50 according to another embodiment of the present invention. The structure of the VECSEL 50 of FIG. 12 is the same as the structure of the VECSEL 50 of FIG. 11, except that a current diffusion layer 49a may be formed on an upper DBR layer 45 of a laser pumping unit 40. The current diffusion layer 49a may be formed of n-GaAs. The current diffusion layer 49a may increase the length of a current path in a vertical direction, thereby increasing the resistance in the vertical direction, resulting in the diffusion of current in a traverse direction. In addition, an anti-reflection film 49b may be coated on the surface of the current diffusion layer 49a in order to prevent the reflection of a light at the surface of the current diffusion layer 49a.

Figure 13:
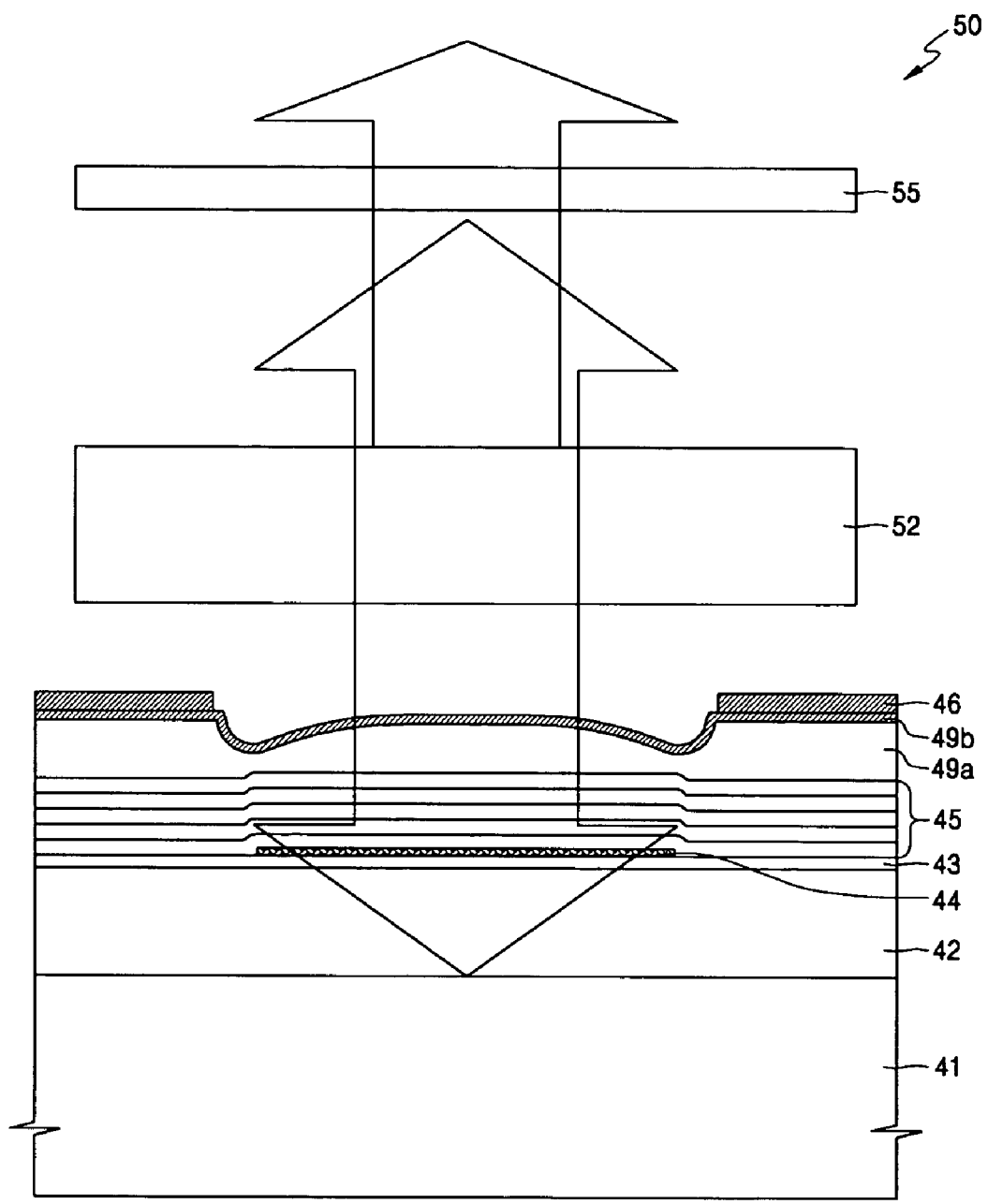

A VECSEL 50 of FIG. 13 is the same as the VECSEL of FIG. 12 except that a portion of a current diffusion layer 49a above a tunnel junction layer 44 is convex. In addition, an external mirror 55 is flat. In the cases of the VECSELs 50 of FIGS. 9 through 12, concave external mirrors 55 may be used to converge the light reflected on the external mirrors 55 in the active layers 43. However, in the VECSEL 50 of FIG. 13, the convex portion of the current diffusion layer 49a converges a beam. Thus, a flat mirror may be used as the external mirror 55. When the external mirror 55 is flat, a laser array can be easily formed. That is, a plurality of convex external mirrors are desirably arranged at precise locations, when a plurality of convex external mirrors are used to form a laser array using a plurality of lasers. However, when using a flat external mirror, one large external mirror can be used as a common external mirror. Thus, the laser array can be conveniently manufactured and assembled. In addition, as described above, the VECSEL 50 of FIG. 12 may include an anti-reflection film 49b coated on the current diffusion layer 49a.

According to the present invention, a high power surface emitting laser device generating a single traverse mode oscillation may be obtained using a simple structure. In addition, an n-DBR having a relatively low free carrier absorption rate can be used as an upper DBR layer due to the inclusion of a tunnel junction layer. Thus, a VECSEL having excellent efficiency can be provided.

Since resistance in a vertical direction may be increased, an operating voltage of a VECSEL may be slightly increased. However, in the case of a high power VECSEL, the increase in operating voltage is desired.

In addition, when a flat mirror is used as an external mirror, a laser array can be easily formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A laser pumping unit for a surface emitting semiconductor laser, the laser pumping unit comprising:
    a substrate;
    a lower distributed brag reflector (DBR) layer formed on the substrate;
    an active layer with a quantum well structure formed on the lower DBR layer to generate a light having a predetermined wavelength;
    an aperture layer formed adjacent the active layer, thereby providing an aperture;
    a tunnel junction layer formed on the active layer;
    an upper DBR layer formed on the tunnel junction layer; and
    a current diffusion layer formed on the upper DBR layer,
    wherein each of the lower DBR layer and the upper DBR layer has a multi-layered structure in which pluralities of n-type doped high refractive index semiconductor layers and n-type doped low refractive index semiconductor layers are alternately deposited, wherein the tunnel junction layer partially covers the active layer, and the edges of the tunnel junction layer are buried by the upper DBR layer, wherein a portion of each of the high refractive index semiconductor layers and the low refractive index semiconductor layers of the upper DBR layer disposed above the tunnel junction layer forms a ridge with a predetermined height, and wherein a portion of the current diffusion layer disposed above the tunnel junction layer forms a convex lens.

2. The laser pumping unit of claim 1, wherein the tunnel junction layer comprises a p-type doped p+ semiconductor layer and an n-type doped n+ semiconductor layer stacked sequentially.

3. The laser pumping unit of claim 2, wherein the doping concentration of each of the p+ semiconductor layer and the n+ semiconductor layer is about $5 \times 10^{18}/cm^3$ to about $5 \times 10^{19}/cm^3$.

4. The laser pumping unit of claim 1, wherein the thickness of the tunnel junction layer is less than about 50 nm.

5. The laser pumping unit of claim 1, wherein the thickness of each of the high refractive index semiconductor layers of the upper DBR layer is three quarters of an oscillation wavelength and the thickness of each of the lower refractive index semiconductor layers is one quarter of the oscillation wavelength.

6. The laser pumping unit of claim 1, wherein the current diffusion layer is formed of n-GaAs.

7. The laser pumping unit of claim 1, further comprising an anti-reflection film coated on the current diffusion layer.

8. A semiconductor laser device comprising:
a laser pumping unit of generating a light with a predetermined wave length; and
an external mirror unit located outside of the laser pumping unit to transmit a portion of the light generated by the laser pumping unit as a laser beam and reflect the other portion of the light toward the laser pumping unit, which absorbs the reflected portion of the light,
wherein the laser pumping unit comprises:
a substrate;
a lower DBR layer formed on the substrate;
an active layer with a quantum well structure formed on the lower DBR layer to generate a light having a predetermined wavelength;
an aperture layer formed adjacent the active layer, thereby defining an aperture;
a tunnel junction layer formed on the active layer;
an upper DBR layer formed on the tunnel junction layer; and
a current diffusion layer formed on the upper DBR layer, wherein each of the lower DBR layer and the upper DBR layer has a multi-layered structure in which pluralities of n-type doped high refractive index semiconductor layers and n-type doped low refractive index semiconductor layers are alternately deposited, wherein the tunnel junction layer partially covers the active layer, and the edges of the tunnel junction layer are buried by the upper DBR layer, wherein a portion of each of the high refractive index semiconductor layers and the low refractive index semiconductor layers of the upper DBR layer disposed above the tunnel junction layer forms a step with a predetermined height, and wherein a portion of the current diffusion layer disposed above the tunnel junction layer forms a convex lens.

9. The laser device of claim 8, wherein the tunnel junction layer comprises a p-type doped p+ semiconductor layer and an n-type doped n+ semiconductor layer stacked sequentially.

10. The laser device of claim 9, wherein the doping concentration of each of the p+ semiconductor layer and the n+ semiconductor layer is about $5 \times 10^{18}/cm^3$ to about $5 \times 10^{19}/cm^3$.

11. The laser device of claim 8, wherein the thickness of the tunnel junction layer is less than about 50 nm.

12. The laser device of claim 8, wherein the thickness of each of the high refractive index semiconductor layers of the upper DBR layer is three quarters of an oscillation wavelength and the thickness of each of the lower refractive index semiconductor layers is one quarter of the oscillation wavelength.

13. The laser device of claim 8, wherein the current diffusion layer is formed of n-GaAs.

14. The laser device of claim 8, further comprising an anti-reflection layer formed on the current diffusion layer.

15. The laser device of claim 8, wherein the external mirror is a flat mirror.

16. The laser device of claim 8, further comprising a second harmonic generation (SHG) crystal for doubling a frequency of the beam interposed between the laser pumping unit and the external mirror.

* * * * *